(12) United States Patent
Uzoh et al.

(10) Patent No.: US 10,008,534 B2
(45) Date of Patent: *Jun. 26, 2018

(54) MICROELECTRONIC PACKAGE WITH HORIZONTAL AND VERTICAL INTERCONNECTIONS

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 15/461,001

(22) Filed: Mar. 16, 2017

(65) Prior Publication Data

US 2017/0186801 A1 Jun. 29, 2017

Related U.S. Application Data

(63) Continuation of application No. 14/845,150, filed on Sep. 3, 2015, now Pat. No. 9,601,467.

(51) Int. Cl.
*H01L 23/48* (2006.01)
*H01L 23/52* (2006.01)
(Continued)

(52) U.S. Cl.
CPC .... *H01L 27/14634* (2013.01); *H01L 23/3114* (2013.01); *H01L 24/09* (2013.01); *H01L 24/20* (2013.01); *H01L 24/24* (2013.01); *H01L 24/46* (2013.01); *H01L 24/49* (2013.01); *H01L 24/82* (2013.01); *H01L 25/0655* (2013.01); *H01L 25/0657* (2013.01); *H01L 27/14618* (2013.01); *H01L 27/14636* (2013.01); *H01L 21/568* (2013.01); *H01L 24/19* (2013.01); *H01L 24/48* (2013.01); *H01L 25/0652* (2013.01); *H01L 2224/04042* (2013.01);
(Continued)

(58) Field of Classification Search
USPC ......... 257/41, 81, 82, 91, 99, 177–182, 772, 257/779, E23.015, E23.02, 257/E23.023–E23.079, E21.508–E21.509, 257/E21.519; 438/612–617, 106, 618
See application file for complete search history.

(56) References Cited

U.S. PATENT DOCUMENTS

| | | |
|---|---|---|
| 7,524,699 B2 | 4/2009 | Fuergut et al. |
| 8,093,104 B1 * | 1/2012 | Lee ............... H01L 21/561 |
| | | 257/E21.499 |
| 8,183,684 B2 | 5/2012 | Nakazato |
| 9,245,828 B2 | 1/2016 | Gupta et al. |
| 9,263,394 B2 | 2/2016 | Uzoh et al. |

(Continued)

*Primary Examiner* — Tram H Nguyen

(57) ABSTRACT

In a microelectronic package, a first wire bond wire is coupled to an upper surface of a substrate. A first bond mass is coupled to another end of the first wire bond wire. A second wire bond wire is coupled to the upper surface. A second bond mass is coupled to another end of the second wire bond wire. The first and second wire bond wires laterally jut out horizontally away from the upper surface of the substrate for at least a distance of approximately 2 to 3 times a diameter of both the first wire bond wire and the second wire bond wire. The first wire bond wire and the second wire bond wire are horizontal for the distance with respect to being co-planar with the upper surface within +/-10 degrees.

13 Claims, 17 Drawing Sheets

(51) Int. Cl.
    *H01L 29/40*     (2006.01)
    *H01L 27/146*     (2006.01)
    *H01L 23/31*     (2006.01)
    *H01L 23/00*     (2006.01)
    *H01L 25/065*     (2006.01)
    *H01L 21/56*     (2006.01)

(52) U.S. Cl.
    CPC ............... *H01L 2224/04105* (2013.01); *H01L 2224/09181* (2013.01); *H01L 2224/32145* (2013.01); *H01L 2224/32225* (2013.01); *H01L 2224/48101* (2013.01); *H01L 2224/48227* (2013.01); *H01L 2224/4903* (2013.01); *H01L 2224/73265* (2013.01); *H01L 2224/73267* (2013.01); *H01L 2224/92244* (2013.01); *H01L 2225/0651* (2013.01); *H01L 2225/06506* (2013.01); *H01L 2924/00014* (2013.01); *H01L 2924/143* (2013.01); *H01L 2924/19104* (2013.01); *H01L 2924/19105* (2013.01)

(56) References Cited

U.S. PATENT DOCUMENTS

| | | | |
|---|---|---|---|
| 9,601,467 B1 * | 3/2017 | Uzoh | H01L 23/3114 |
| 2001/0028104 A1 * | 10/2001 | Fukatsu | H01L 25/0657 |
| | | | 257/685 |
| 2009/0014876 A1 | 1/2009 | Youn et al. | |
| 2011/0242782 A1 | 10/2011 | Wang | |
| 2014/0132368 A1 * | 5/2014 | Tsuda | H03H 3/08 |
| | | | 333/193 |
| 2015/0228625 A1 | 8/2015 | Lim et al. | |

\* cited by examiner

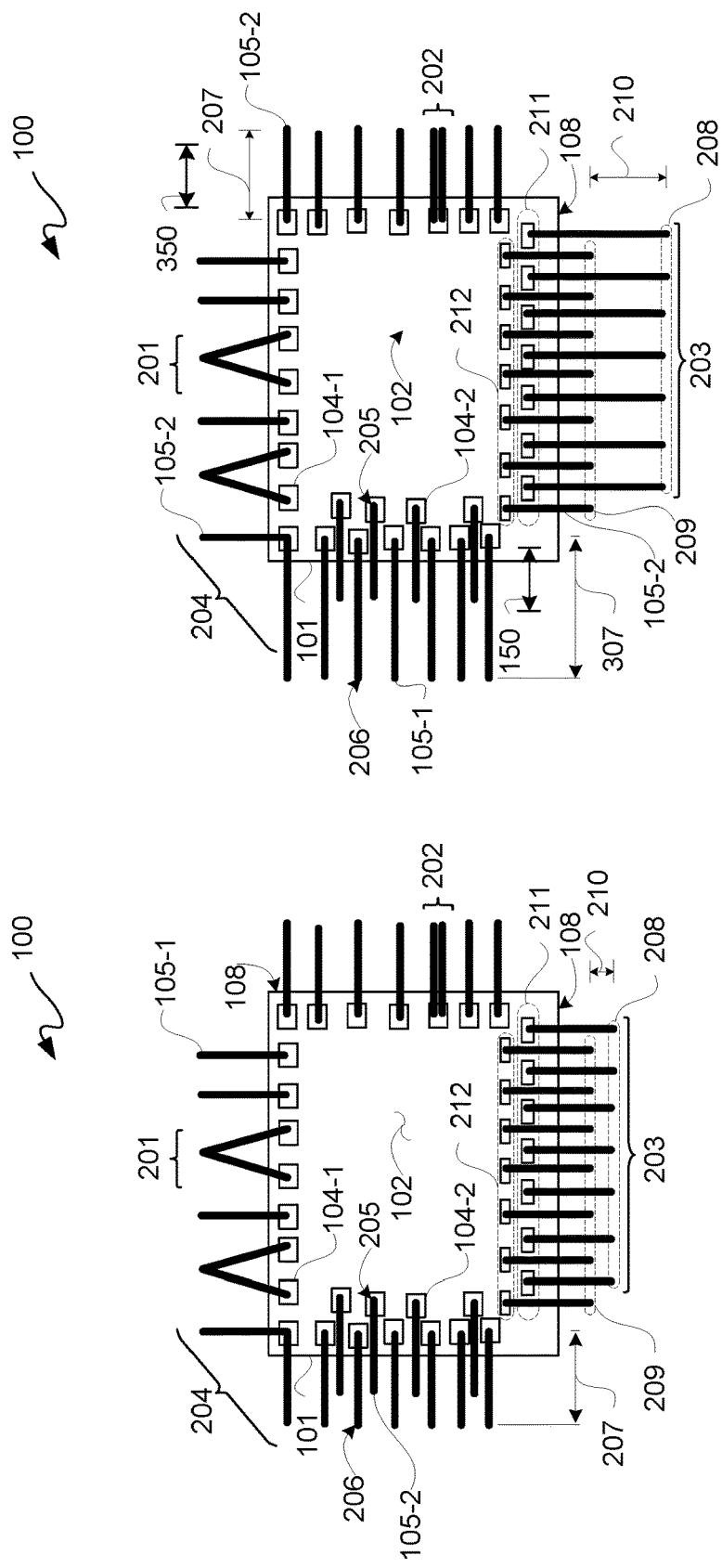

MICROELECTRONIC PACKAGE WITH HORIZONTAL AND VERTICAL INTERCONNECTIONS

CROSS-REFERENCE TO RELATED APPLICATIONS

This application is a continuation of and claims the benefit of priority to U.S. patent application Ser. No. 14/845,150, filed Sep. 3, 2015, the entirety of which is incorporated by reference herein for all purposes.

FIELD

The following description relates to integrated circuits ("ICs"). More particularly, the following description relates to a microelectronic package with wires for interconnection to bond masses bonds for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

Conventional interconnecting of an IC has issues with respect to height. Many low-profile applications, such as mobile phones, notebook computers, and electronic tablets, among other low-profile applications, have limited headroom for microelectronic packages. Additionally, such applications may have limited floor space for microelectronic packages.

Accordingly, it would be desirable and useful to provide more compact microelectronic packages for applications having limited headroom and/or floor space.

BRIEF SUMMARY

An aspect relates generally to a microelectronic package. In such a microelectronic package, there is a substrate having an upper surface and a lower surface opposite the upper surface. A first wire bond wire of a first length is coupled to the upper surface at a first end of the first wire bond wire. A first bond mass is coupled to a second end of the first wire bond wire. A second wire bond wire of a second length is coupled to the upper surface at a first end of the second wire bond wire. A second bond mass is coupled to a second end of the second wire bond wire. The first wire bond wire and the second wire bond wire laterally jut out horizontally away from the upper surface of the substrate for at least a distance of approximately 2 to 3 times a diameter of both the first wire bond wire and the second wire bond wire. The first wire bond wire and the second wire bond wire are horizontal for the distance with respect to being co-planar with the upper surface within +/−10 degrees.

An aspect relates generally to another microelectronic package. In such a microelectronic package, there is a substrate having an upper surface and a lower surface opposite the upper surface. First wire bond wires of a first length are coupled to the upper surface at first ends of the first wire bond wires. First bond masses are coupled to second ends of the first wire bond wires. The first wire bond wires laterally jut out from the upper surface of the substrate. Second wire bond wires of a second length are coupled to the upper surface at first ends of the second wire bond wires. Second bond masses are coupled to second ends of the second wire bond wires. The second wire bond wires laterally jut out horizontally away from the upper surface of the substrate for at least a distance of approximately 2 to 3 times a diameter of a second wire bond wire of the second wire bond wires. The second wire bond wire is horizontal for the distance with respect to being co-planar with the upper surface within +/−10 degrees.

An aspect relates generally to yet another microelectronic package. In such a microelectronic package, there are first and second substrates having respective upper surfaces. Wire bond wires are coupled to the upper surfaces of the first and second substrates at first ends of the first wire bond wires. Bond masses are coupled to second ends of the wire bond wires. The wire bond wires laterally jut out from the upper surfaces of the first and second substrates. A first portion of the wire bond wires are commonly coupled to a second portion of the wire bond wires at the bond masses.

An aspect relates generally to still yet another microelectronic package. In such a microelectronic package, a first substrate has a first upper surface and a first lower surface opposite the first upper surface. A second substrate has a second upper surface and a second lower surface opposite the second upper surface. The second substrate is coupled to the first substrate with the first upper surface facing the second lower surface. A first wire bond wire is coupled to the first upper surface at a first end of the first wire bond wire and extends vertically away from the first upper surface of the first substrate. A bond mass is coupled to a second end of the first wire bond wire. A second wire bond wire is coupled to a contact of the second substrate at a first end of the second wire bond wire and coupled to the bond mass a second end of the second wire bond wire. The second wire bond wire laterally juts out horizontally away from the second upper surface of the second substrate for at least a distance of approximately 0.5 to 3 times a diameter of the second wire bond wire. The second wire bond wire is horizontal for the distance with respect to being co-planar with the second upper surface within +/−10 degrees.

An aspect relates generally to further still yet another microelectronic package. In such a microelectronic package, a first substrate has a first upper surface and a first lower surface opposite the first upper surface. A second substrate has a second upper surface and a second lower surface opposite the second upper surface. The second substrate is coupled to the first substrate with the first upper surface facing the second lower surface. A wire bond wire is coupled to the first upper surface at a first end of the wire bond wire and extends vertically away from the first upper surface of the first substrate. A molding layer covers side portions of both the first substrate and the wire bond wire. A surface interconnect on the molding layer is coupled to a contact of the second substrate at a first end of the surface interconnect and coupled to a second end of the second wire bond wire at a second end of the surface interconnect.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 2 is a block diagram of a top view depicting another view of the exemplary microelectronic package of FIG. 1.

FIG. 3 is a block diagram of a top view depicting another exemplary microelectronic package.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Figure 1:
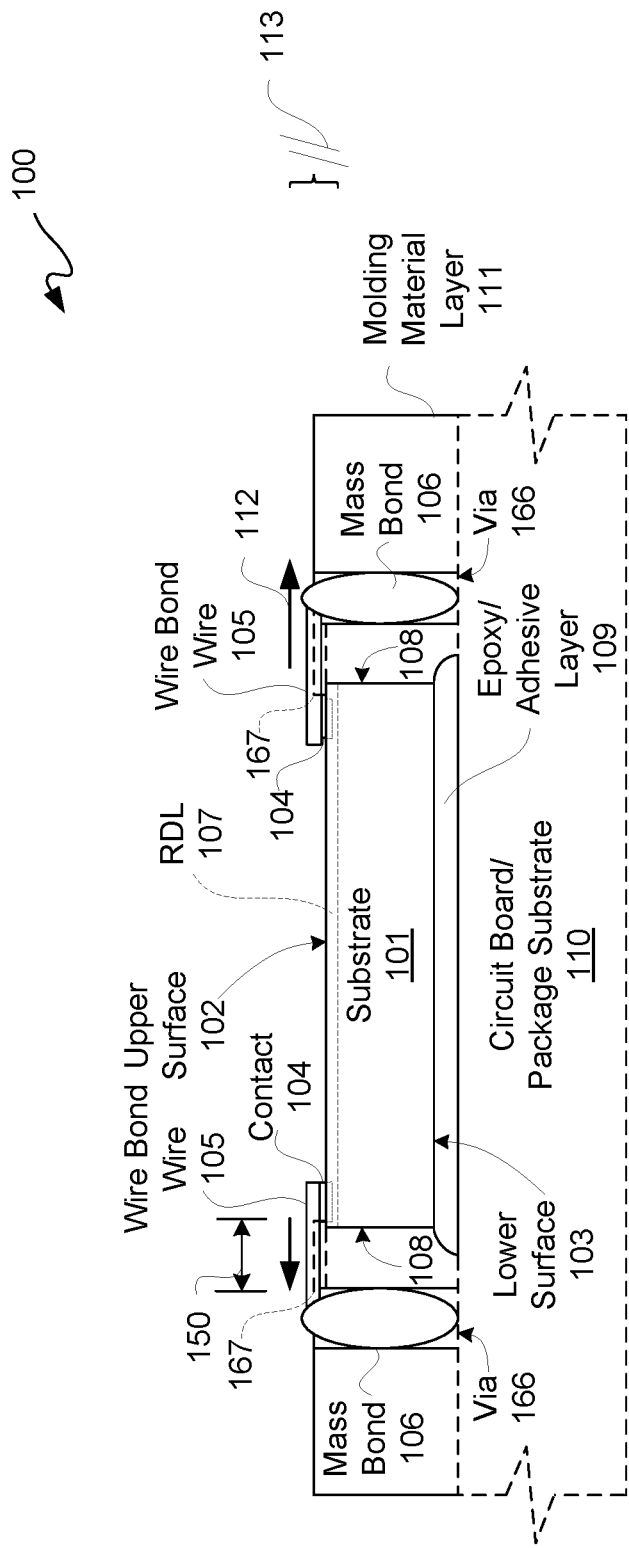
FIG. 1 is a block diagram of a side view depicting an exemplary microelectronic package.

FIG. 1 is a block diagram of a side view depicting an exemplary microelectronic package 100. Microelectronic package 100 may be for a low-profile application, such as an electronic tablet, mobile phone, notebook computer, and/or other thin form factor application.

Microelectronic package 100 includes a substrate 101 having an upper surface 102 and a lower surface 103 opposite upper surface 102. Optionally, substrate 101 may be coupled to a circuit board or package substrate 110, such as with an epoxy or other adhesive layer 109 located between lower surface 103 and an upper surface of circuit board/package substrate 110. For purposes of clarity by way of example and not limitation, it shall be assumed that a package substrate 110 is used.

Substrate 101 may be a semiconductor integrated circuit die. Substrate 101 may optionally have a redistribution layer ("RDL") 107 along upper surface 102. RDL 107 may include electrical pads or contacts 104. Optionally, contacts 104 may be formed without an RDL 107 as part of substrate 101. In this example implementation, contacts 104 are generally located proximal to a perimeter, namely sidewalls 108, of an upper surface 102 of substrate 101. This is to allow a central region of upper surface 102 of substrate 101 to be unobstructed for receiving image information. Along those lines, substrate 101 may include an array of image sensors positioned for receiving image information at such upper surface 102.

A molding material may be deposited, such as by injection into a mold for example, for forming a molding material layer 111. Optionally, molding material layer 111 may be deposited on package substrate 110. Vias 166 may be formed in molding material layer 111 from a top surface to a bottom surface thereof. Such vias 166 may have deposited therein one or more electrically conductive materials for forming bond masses 106. Optionally, trenches 167, as well as vias 166, may be etched into molding material layer 111, such as for a wafer-level implementation. Trenches 167 or vias 166 or both may be etched along an upper surface of molding material layer 111 for receiving such one or more electrically conductive materials.

In a reconstituted wafer-level implementation, plated or otherwise deposited wires 105 may be plated into such trenches or pads 167, followed by depositing electrically conductive material into vias 166 to form bond masses 106. In another implementation, plated wires 105 and bond masses 106 may be plated in a same operation with one or more same materials followed by a lift-off to remove plating material from a top surface of molding material layer 111. However, in yet another implementation, whether wafer-level or reconstituted wafer or substrate or panel or chip-level, wire bond wires 105 may be formed to interconnect contacts 104 with bond masses 106. For purposes of clarity by way of example and not limitation, it shall be assumed that wire bond wires 105 are used for interconnection to bond masses 106. Along those lines, for purposes of clarity and not limitation, it shall be assumed that bond masses 106 are formed of a solder material, even though other types of electrically conductive materials may be used in other implementations.

Wire bond wires 105, which may be stitch bonded or ball bonded to contacts 104 and/or bond masses 106, may extend laterally in a direction generally indicated with arrows 112 away from sidewalls 108. Wire bond wires 105 may laterally jut out horizontally, as defined herein, away from upper surface 102 of substrate 101 for at least an offset distance 150 of approximately 0.5 to 3 times a diameter of such wire bond wires 105. In another implementation, wire bond wires 105 may laterally jut out horizontally away from upper surface 102 of substrate 101 for at least an offset distance 150 of approximately 3 to 5 times a diameter of such wire bond wires. Lastly, in yet another implementation, wire bond wires 105 may laterally jut out horizontally away from upper surface 102 of substrate 101 for at least an offset distance 150 of approximately 5 to 10 times a diameter of such wire bond wires. Wire bond wires 105 may be horizontal over such a diameter dependent offset distance 150 with respect to being co-planar 113 with upper surface 102 within +/−10 degrees, as generally indicated with parallel lines 113. By being co-planar with an upper surface 102, it is generally meant a flat region of a central portion of a substrate's upper surface. Accordingly, horizontal as defined herein means having a horizontal component that is co-planar or parallel 113 with respect to a flat central portion of an upper surface 102 within +/−10 degrees. Offset distance 150 may be measured starting from an outer contact edge of a wire bond wire 105 to a contact 104, namely a contact edge proximal to a sidewall 108. Even though wire bond wires 105 of FIG. 1 may all be of generally a same length, wire bond wires 105 of different lengths, as well as different diameters, may be used as described below in additional detail. Also, in some applications, one or more wire bond wires 105 may be grounded to substrate 101 using one or more corresponding bond masses 106.

FIG. 2 is a block diagram of a top view depicting another view of the exemplary microelectronic package 100 of FIG. 1. In this view of the exemplary microelectronic package 100, wire bond wires 105-1 and 105-2 are generally of equal lengths 207. Lateral extension and co-planarity may be as described above. As much of the description of microelectronic package 100 of FIG. 2 is the same as the description of microelectronic package 100 of FIG. 1, such same description is not repeated for purposes of clarity.

Ends 205 of wire bond wires 105-2 may be coupled to one or more inner contacts or rows 212 of inner contacts 104-2, and ends 205 of wire bond wires 105-1 may be coupled to one or more outer contacts or rows 211 of outer contacts 104-1. Ends 206 of wire bond wires 105-1 and wire bond wires 105-2 may form two rows 208 and 209 respectively thereof spaced apart a distance 210 from one another.

Even though wire bond wires 105-1 and 105-2 may have generally same lengths, wire bond wires 105-1 may be coupled to upper surface 102 closer to sidewall 108 of substrate 101 via contacts 104-1 at ends 205 of such wires, and wire bond wires 105-2 may be coupled to upper surface 102 further from sidewall 108 of substrate 101 via contacts 104-2 at ends 205 of such wires. Ends 206 of wire bond wires 105-1 and 105-2 may laterally jut out horizontally away from upper surface 102 of substrate 101. However, ends 206 of wire bond wires 105-1 may be situated further away from sidewall 108 of substrate 101 than ends 206 of wire bond wires 105-1. Alternatively stated, ends 206 of wire bond wires 105-2 may be situated closer to sidewalls 108 of substrate 101 than ends 206 of wire bond wires 105-1. This may be used for offsetting ends 206 of wire bond wires 105 from one another for interconnect to separate rows and/or columns of bond masses 106 of FIG. 1 for example.

Along those lines, wire bond wires 105-1 and 105-2 may be interleaved 203 with one another for respectively coupling to a row, or column, 211 of contacts 104-1 and a row, or column, 212 of contacts 104-2. Upper surface 102 of substrate 101 may include one or more rows 212 of inner contacts 104-2 and one or more rows 211 of outer contacts 104-1, where such inner rows, or columns, 212 may be located between outer rows, or columns, 211.

A row of bond masses, generally indicated as row 208, may be coupled to ends 206 of interleaved wire bond wires 105-1, and a row of bond masses, generally indicated as row 209, may be coupled to ends 206 of interleaved wire bond wires 105-2. An offset distance 210 between ends 206 of wire bond wires 105-1 and 105-2 due to an offset distance between outer contacts 104-1 and inner contacts 104-1 may be used for having separate rows of bond masses. First bond masses and second bond masses respectively associated with 208 and 209 may interconnect wire bond wires 105-1 and wire bond wires 105-2 to a circuit board or package substrate 110.

Moreover, individual wire bond wires 105 may, though need not be, coupled to individual contacts or pads 104. A pair 202 of wire bond wires 105 may be coupled to a same contact 104 and a same bond mass, such as to increase conductivity for an application, such as a ground or a supply voltage for example. Optionally or alternatively, wire bond wires 105 may be interconnected to one another at ends 206 respectively thereof to form a "V-shaped" interconnect 201 for more conductivity. A V-shaped interconnect 201 may be coupled to a common bond mass 106. Optionally or alternatively, wire bond wires 105 may be interconnected to one another at ends 205 respectively thereof at a corner contact 104 to form an "L-shaped" interconnect 204 for more conductivity.

FIG. 3 is a block diagram of a top view depicting another exemplary microelectronic package 100. As much of the description of microelectronic package 100 is the same as the description of microelectronic package 100 of FIGS. 1 and 2, such same description is not repeated for clarity.

In this exemplary microelectronic package 100, wire bond wires 105-1 and 105-2 are of unequal lengths 307 and 207, respectively. Though lengths 207 and 307 are different lengths, they may be of same or different diameters. Wire bond wires 105-1 or 105-2, which may be stitch bonded or ball bonded to contacts 104 and/or bond masses 106, may extend laterally in a direction generally away from sidewalls 108.

Wire bond wires 105-1 may laterally jut out horizontally away from upper surface 102 of substrate 101 for at least an offset distance 150 of approximately 2 to 3 times a diameter of such wire bond wires. In another implementation, wire bond wires 105-1 may laterally jut out horizontally away from upper surface 102 of substrate 101 for at least an offset distance 150 of approximately 0.5 to 5 times a diameter of such wire bond wires. Lastly, in yet another implementation, wire bond wires 105-1 may laterally jut out horizontally away from upper surface 102 of substrate 101 for at least an offset distance 150 of approximately 5 to 10 times a diameter of such wire bond wires. Such offset distance 150 may or may not be an entire span of such wire bond wire 105-1 from contact 104-1 to corresponding bond mass 106. Wire bond wires 105-1 may be horizontal over such a diameter dependent offset distance 150 with respect to being co-planar 113 with upper surface 102 within +/−10 degrees.

Offset distance 150 may be measured starting from an outer contact edge of a wire bond wire 105-1 to a contact 104-1, namely a contact edge proximal to a sidewall 108. Even though wire bond wires 105-1 of FIG. 1 may all generally be of a same length, wire bond wires 105-1 may be of different lengths, as well as different diameters.

Wire bond wires 105-2 are shorter than wire bond wires 105-1. Wire bond wires 105-1 and 105-2 form two rows 209 and 208, respectively, of ends 206 respectively thereof. Along those lines, distance of separation 210 between rows 208 and 209 may be increased for interconnection of respective sets of bond masses 106. Moreover, diameters of wire bond wires 105-2 may be the same, larger, or smaller than diameters of wire bond wires 105-1. However, generally, as wire bond wires 105-2 are shorter, diameters of such wires may be smaller than diameters of wire bond wires 105-1, as wire bond wires 105-2 may not have to be horizontal as defined herein for as long a distance as wire bond wires 105-1.

Wire bond wires 105-2 may laterally jut out horizontally away from upper surface 102 of substrate 101 for at least a distance 350 of approximately 2 to 3 times a diameter of such wire bond wires. In another implementation, wire bond wires 105-2 may laterally jut out horizontally away from upper surface 102 of substrate 101 for at least a distance 350 of approximately 3 to 5 times a diameter of such wire bond wires. Lastly, in yet another implementation, wire bond wires 105-2 may laterally jut out horizontally away from upper surface 102 of substrate 101 for at least a distance 350 of approximately 5 to 10 times a diameter of such wire bond wires. Such distance 350 may or may not be an entire span of such wire bond wire 105-2 from contact 104-2 to corresponding bond mass 106. Wire bond wires 105-2 may be horizontal over such a diameter dependent distance 350 with respect to being co-planar 113 with upper surface 102 within +/−10 degrees.

Figure 4A:
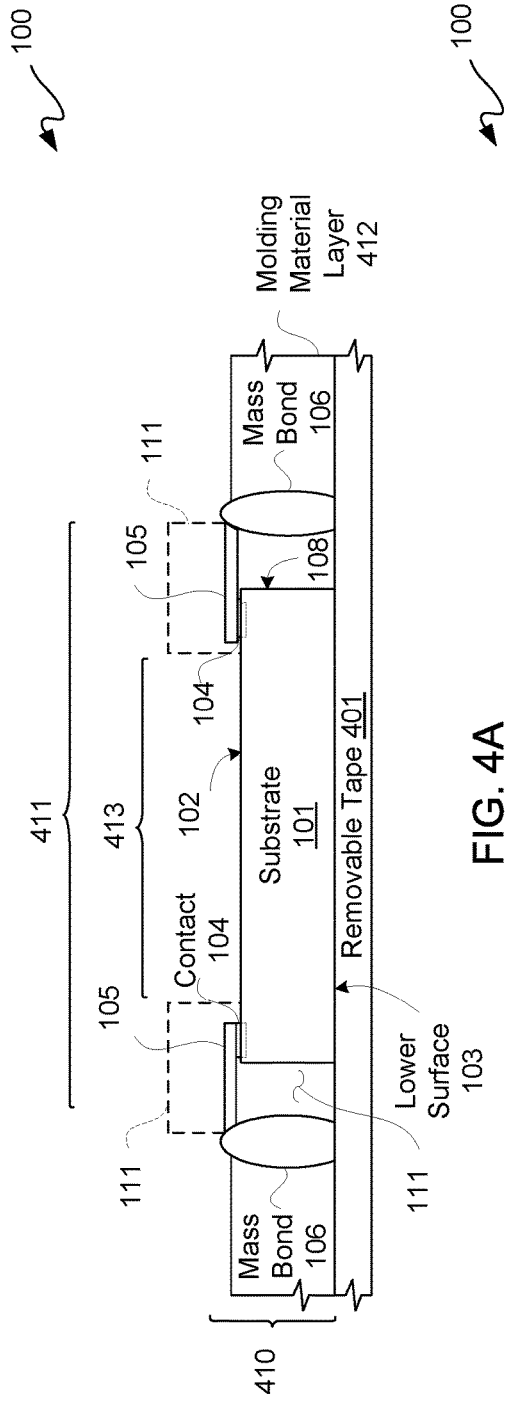
FIG. 4A is the block diagram of FIG. 1 with a circuit board or package substrate thereof replaced with removable tape.

FIG. 4A is the block diagram of FIG. 1 with circuit board or package substrate 110 replaced with removable tape 401. As much of the description of microelectronic package 100 is the same as the description of microelectronic package 100 of FIGS. 1 through 3, such same description is not repeated for clarity.

Along those lines, microelectronic package 100 may be formed at a wafer level on a disposable or reusable substrate (not shown in FIG. 4A), namely wafer-level assembly 410. Molding material layer 111 may be deposited followed by dicing into microelectronic sub-assemblies 411.

Optionally, such microelectronic sub-assemblies 411 may include formation of wire bond wires 105 at this juncture, namely prior to formation of bond masses 106. Along those lines, optional molding material layer 111 may encapsulate wire bond wires 105 except for distal ends 206. Optionally, distal ends 206 may be temporarily encapsulated with molding material layer 111 followed by a reveal of such ends 206 by removing corresponding portions of molding material layer 111, such as by a wet etch for example. A central area 413 of an upper surface 102 may be masked off or otherwise protected from molding material layer 111. Optionally, molding material layer 111 may be removed from such central area 413, if masking or other protection is not used.

Microelectronic sub-assemblies 411 may be diced from such wafer-level assembly 410. These microelectronic sub-assemblies 411 may optionally be individually tested and/or tested as part of a wafer-level assembly 410. A lower surface of such microelectronic sub-assemblies 411 passing such testing may be placed on removable tape 401.

Another molding material layer 412 may be added for forming a reconstituted wafer as a reconstituted wafer-level assembly 410, and bond masses 106 may be subsequently formed. Wire bond wires 105 may then be attached to contacts 104 and bond masses 106, such as previously described. Optionally, as described above, wire bond wires 105 may have previously been formed, and thus bond masses 106 may be formed for attachment thereto. Lateral extension and co-planarity of wire bond wires 105 may be as previously described.

Figure 4B:
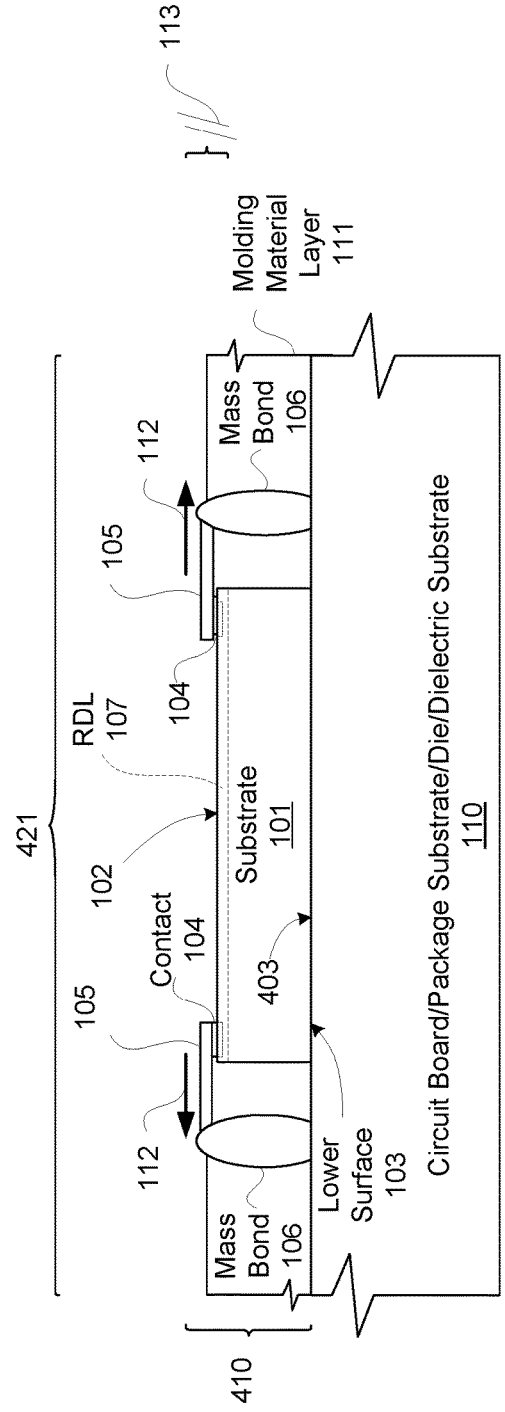
FIG. 4B is the block diagram of FIG. 4A with a circuit board or package substrate replacing the removable tape thereof.

FIG. 4B is the block diagram of FIG. 4A with circuit board or package substrate 110 replacing removable tape 401. Removable tape 401 may be removed before or after dicing microelectronic sub-assemblies 421 from a reconstituted wafer-level assembly 410. One or more substrates 101 may be included in each microelectronic sub-assembly 421.

A lower surface 103 of one or more microelectronic sub-assemblies 421 may be attached to an upper surface 403 of a circuit board, package substrate, another integrated circuit die, an interposer, or a dielectric substrate 110. Even though an epoxy or other adhesive layer 109 may be used, as previously described, bond masses 106 may be reflowed for attachment of one or more microelectronic sub-assemblies 421 to an upper surface 403. For example, a glass dielectric substrate 110 may be used with electrical contacts, and reflowing may be for attachment to such electrical contacts of such glass dielectric substrate. Again, for purposes of clarity by way of example and not limitation, it shall be assumed that a package substrate 110 is used.

Figure 5A:
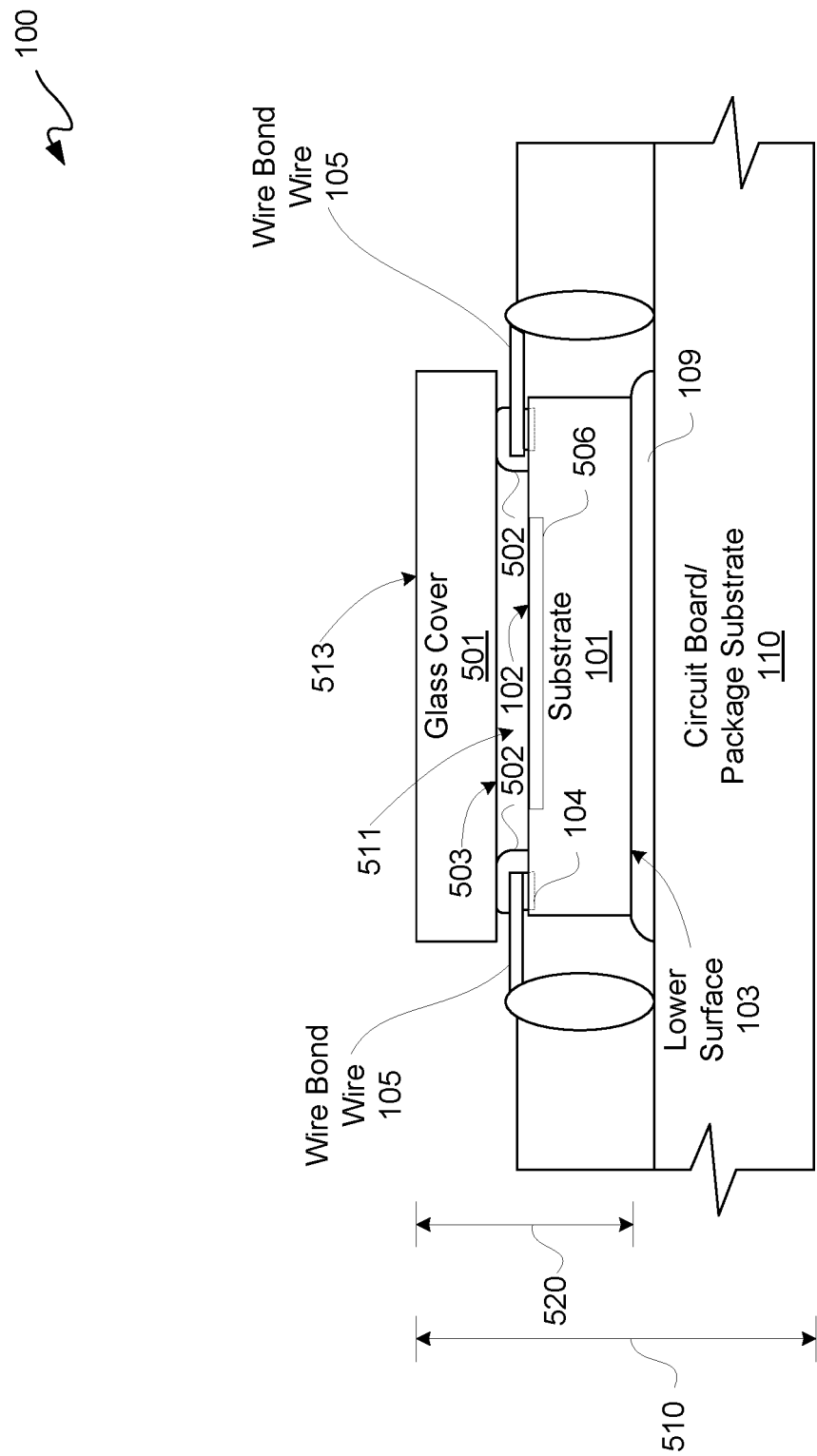
FIG. 5A is a block diagram depicting an exemplary low-profile microelectronic package for image capture.

FIG. 5A is a block diagram depicting an exemplary low-profile microelectronic package 100 for image capture. Generally, FIG. 5A is the block diagram of FIG. 1 with a package substrate 110, as well as a glass cover 501. As much of the description of microelectronic package 100 is the same as the description of microelectronic package 100 of FIGS. 1 through 4B, such same description is not repeated for clarity.

A substrate 101, such as an integrated circuit die, may include an array of sensors 506 for capturing an image. Such an array of sensors 506 may be centrally located with respect to upper surface 102, such that contacts 104 and wire bond wires 105 do not interfere with image information obtained by such array of sensor 506. Sensors of such array of sensors 506 may be well-known, and thus are not described in unnecessary detail.

A glass cover 501 may be located over, spaced apart from and coupled to an upper surface 102 of substrate 101. In this example, an epoxy layer 109 is used for attachment as previously described to avoid heat associated with reflow. However, if reflow heat is within a thermal budget of microelectronic package 100, epoxy layer 109 may be omitted for attachment via reflow as previously described to further reduce height 510 for a low-profile microelectronic package 100.

A lower surface 503 of glass cover 501 may be spaced-apart from and opposite upper surface 102 of substrate 101 for defining a gap 511 therebetween. Gap 511 may be an air gap. An epoxy or other adhesive layer or islands 502 may be placed on wire bond wires 105 over or proximal to contacts 104. Optionally, contacts 104 may be completely or partially recessed in substrate 101 to reduce height 510.

Vertical distance or height 520 from an upper surface 513 of glass cover to a lower surface 103 of substrate 101 may be in a range of approximately 0.5 to 500 microns. Having horizontal wire bond wires 105, as described herein, may be useful in forming a low-profile microelectronic package 100. A low-profile microelectronic package 100 may be useful in thin devices, such as mobile phones, electronic tablets, notebook computer, and/or other devices integrating a camera.

Figure 5B:
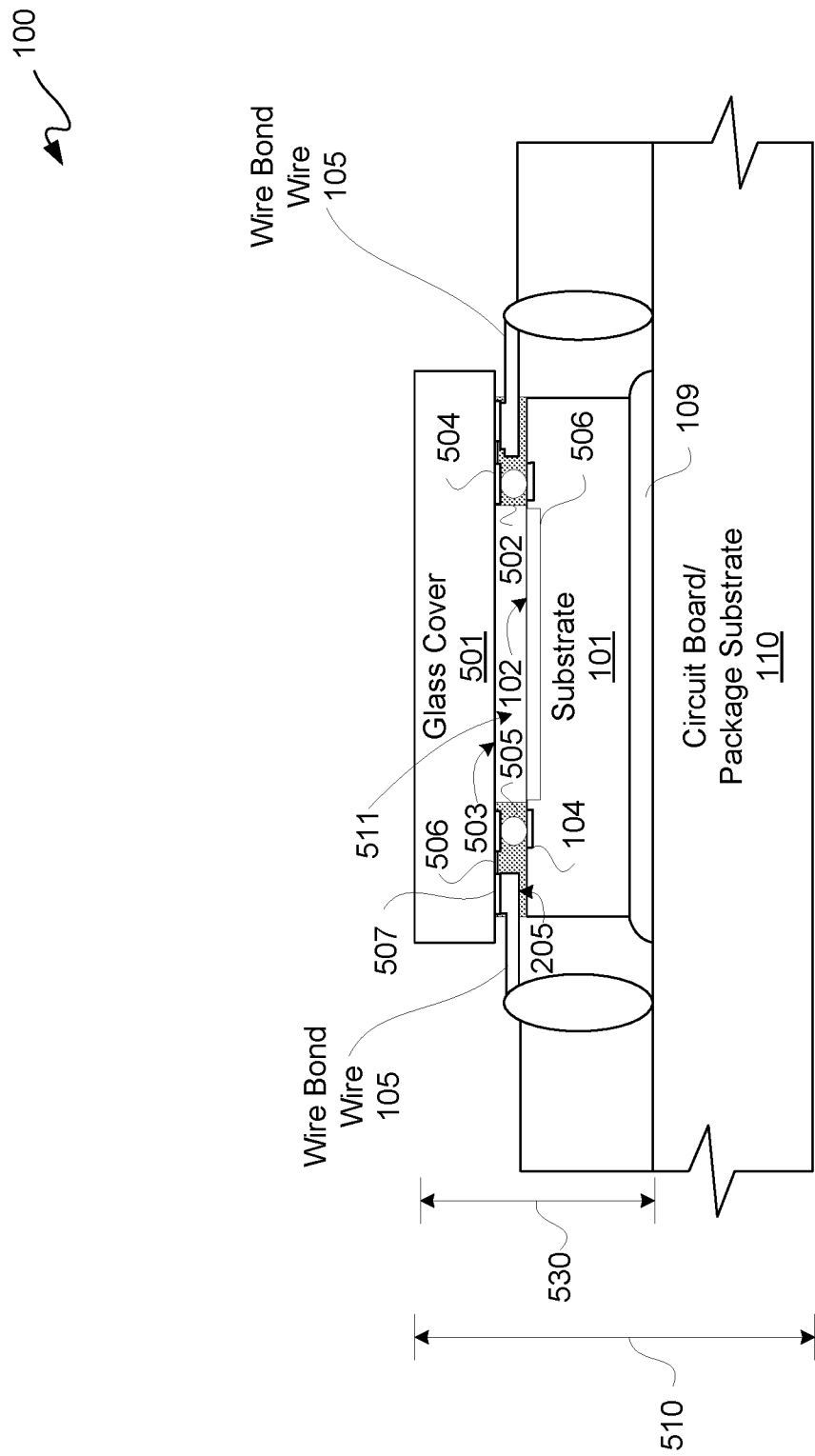
FIG. 5B is a block diagram depicting another exemplary low-profile microelectronic package for image capture.

FIG. 5B is a block diagram depicting another exemplary low-profile microelectronic package 100 for image capture. As much of the description of microelectronic package 100 is the same as the description of microelectronic package 100 of FIG. 5A, such same description is not repeated for clarity.

A lower surface 503 of glass cover 501 includes inner pads 504 and outer pads 507 interconnected to one another with traces 506. Traces 506 may be thinner than pads 504 and 507. Traces 506 and pads 504, 507 may be formed by electroplating with subsequent liftoff. Inner pads 504 may be located between outer pads 507 for alignment with contacts 104.

Ends 205, which may be of wire bond wires 105-1 and/or 105-2, may be coupled to outer pads 507, such as with stitch or ball bonding of wire bond wires. Contacts 104 on upper surface 102, including without limitation being recessed, of substrate 101, such as an integrated circuit die, may be interconnected to inner pads 504, such as with solder balls 505 for example. An epoxy or other adhesive layer or islands 502 may be placed on wire bond wires 105 over or proximal to contacts 104, as well as may be placed for encapsulating pads 504, 507 and traces 506. Vertical distance or height 530 from an upper surface 513 of glass cover to a lower surface of epoxy layer 109 may be in a range of approximately 0.5 to 500 microns.

Figure 5C:
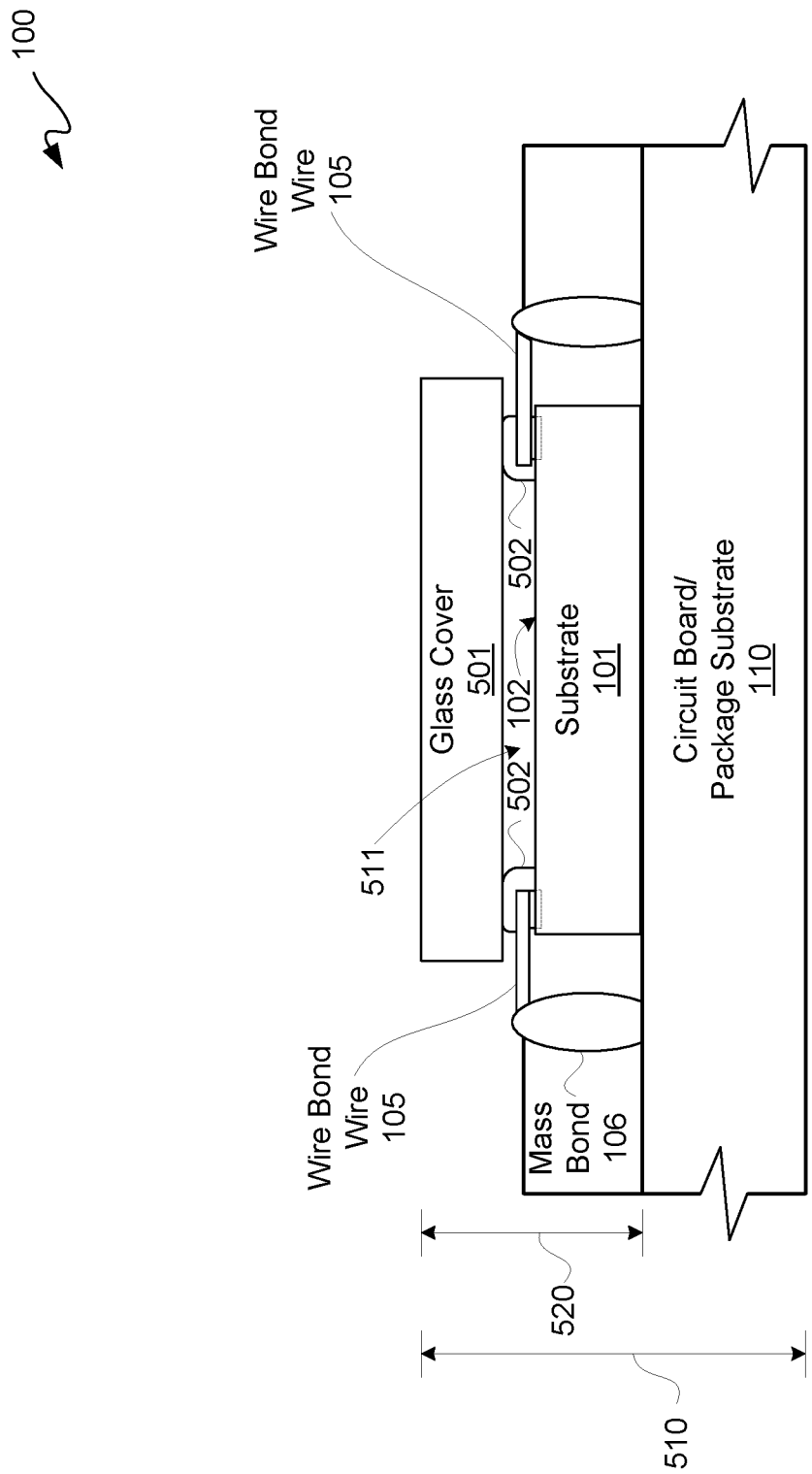
FIG. 5C is the block diagram of FIG. 5A depicting an exemplary low-profile microelectronic package for image capture without an epoxy layer.

FIG. 5C is the block diagram of FIG. 5A depicting an exemplary low-profile microelectronic package 100 for image capture without epoxy layer 109. In this example, bond masses 106 are reflowed for attachment of lower ends thereof to an upper surface of a package substrate 110, such as previously describe. Thus, a lower profile may be obtained by omission of epoxy layer 109 to lower height 520.

Figure 6A:
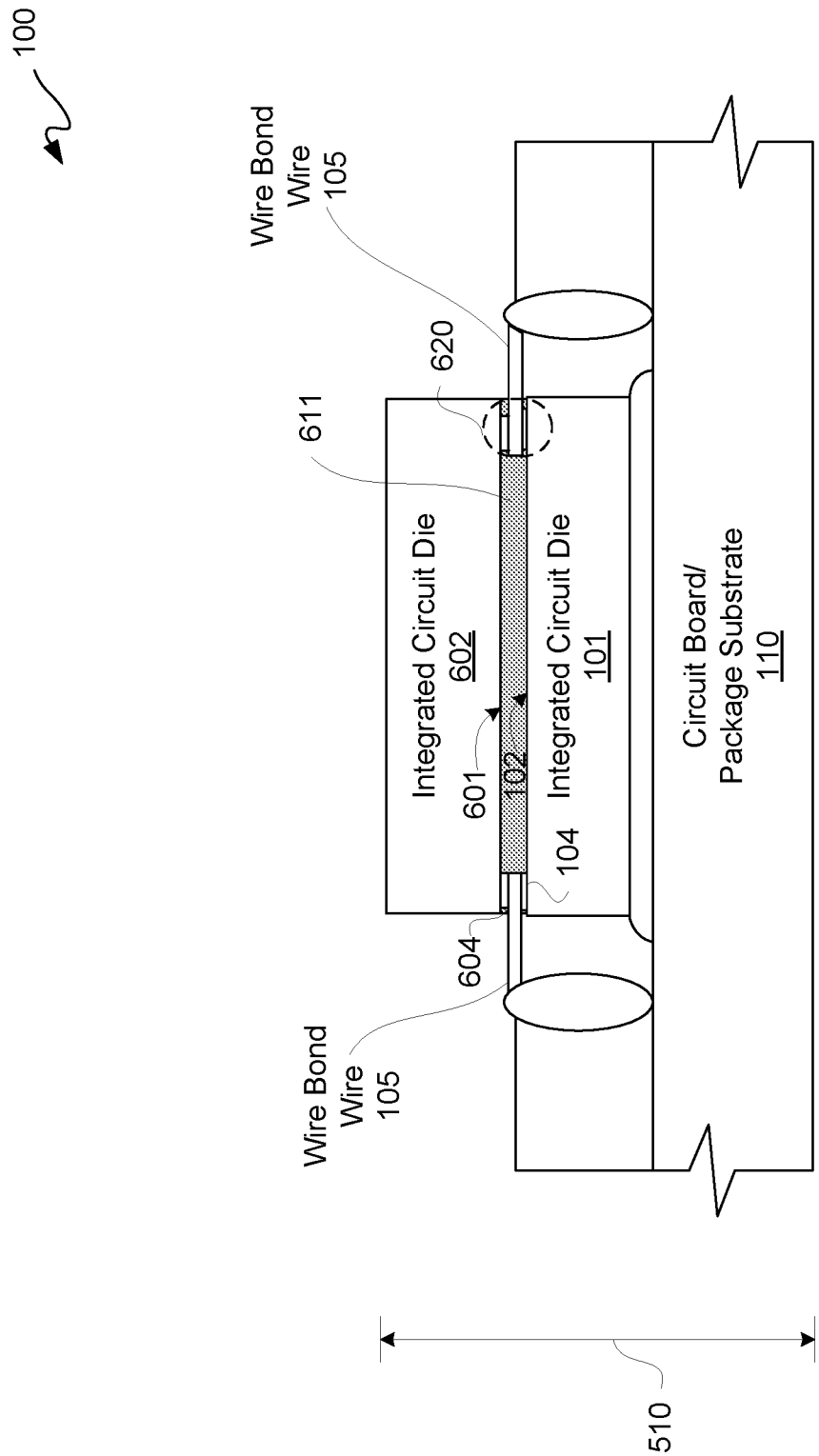
FIG. 6A is a block diagram depicting an exemplary low-profile vertical die stack ("3DIC") microelectronic package.

FIG. 6A is a block diagram depicting an exemplary low-profile vertical die stack ("3DIC") microelectronic package 100. A 3DIC may be used in applications with limited floor space, but adequate headroom, such as desktop computers and workstation notebook computers for example. As much of the description of microelectronic package 100 is the same as the description of microelectronic package 100 of FIGS. 1 through 5B, such same description is not repeated for clarity.

In this example, substrate 101 is an integrated circuit die. Another integrated circuit die 602 may be located over, spaced apart from and coupled to an upper surface 102 of integrated circuit die 101. Along those lines, contacts 104 of integrated circuit die 101 may be interconnected to wire bond wires 105, as previously described.

Integrated circuit die 602 may have contacts 604 along a surface 601 facing upper surface 102. Contacts 604 may be vertically aligned with contacts 104. Contacts 604 may be coupled to wire bond wires 105 for forming common interconnects 620 with contacts 104. This coupling of contacts 604 to wire bond wires 105 may be made by applying pressure and/or heat for forming such interconnects. An underfill layer 611 may be injected between integrated circuit dies 101 and 602. Optionally, such underfill layer 611 may extend outside of contacts 104 and 604 for encapsulating exposed portions thereof. Common interconnects 620 may be used for sharing ground, supply voltage, or reference signals for example between integrated circuit dies 101 and 602. Moreover, vertical height 510 may be for a low-profile application, such as an electronic tablet, mobile phone, notebook computer, and/or other thin form factor application. For example, integrated circuit die 101 may be a microprocessor die, and integrated circuit die 602 may be a memory die.

Figure 6B:
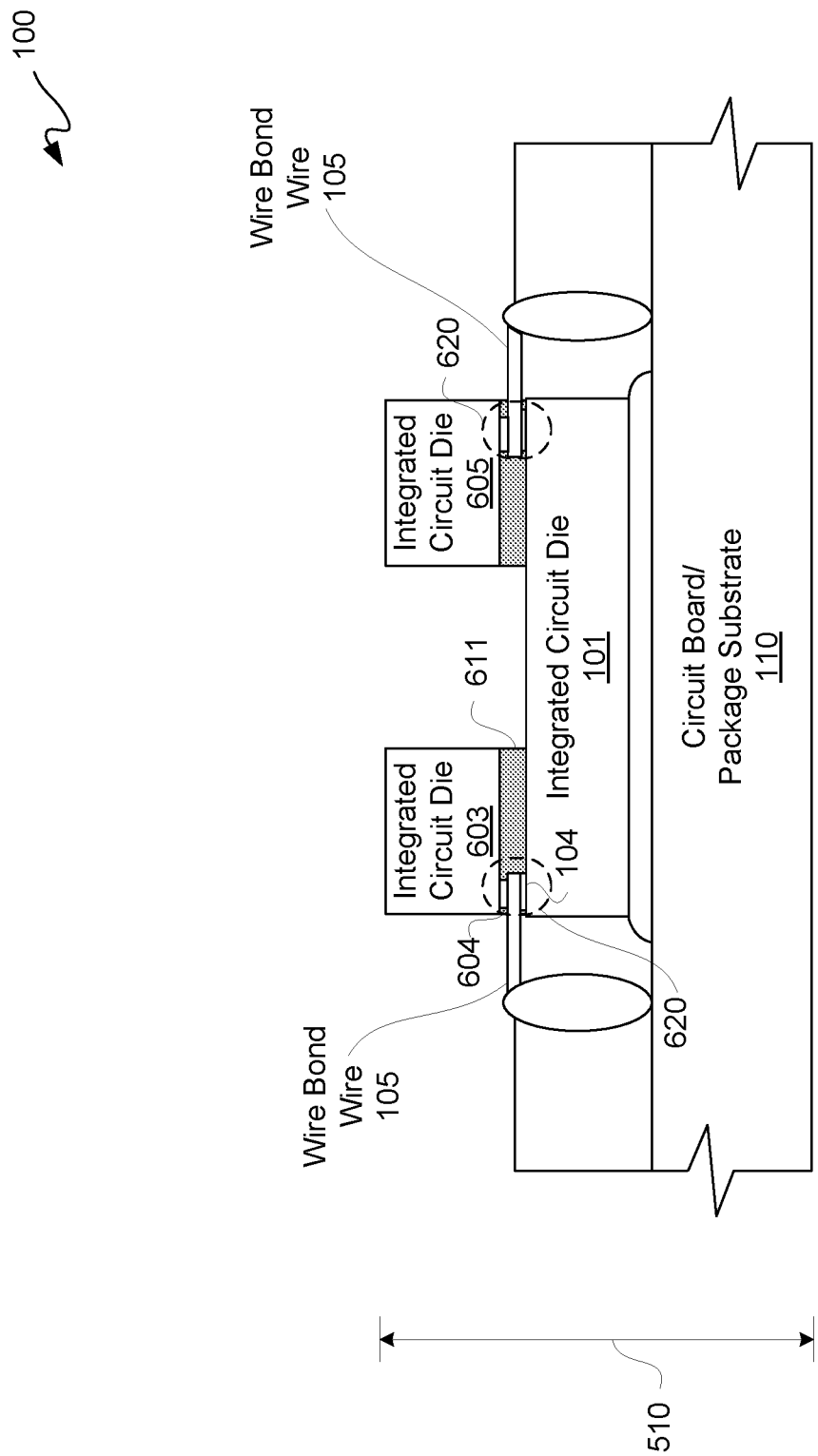
FIG. 6B is a block diagram depicting another exemplary low-profile 3DIC microelectronic package.

FIG. 6B is a block diagram depicting another exemplary low-profile 3DIC microelectronic package 100. As much of the description of microelectronic package 100 is the same as the description of microelectronic package 100 of FIG. 6A, such same description is not repeated for clarity. Generally, microelectronic package 100 of FIG. 6B is the same as microelectronic package 100 of FIG. 6A, except rather than a single integrated circuit die 602, two smaller integrated circuit dies 603 and 605 are coupled to opposing sides of integrated circuit die 101. Each of integrated circuit dies 603 and 605 is coupled to integrated circuit die 101 with common interconnects 620. An ability to interconnect multiple integrated circuit dies to one another in a same low-profile package may be useful in forming hybrid devices for low-profile applications.

Figure 6C:
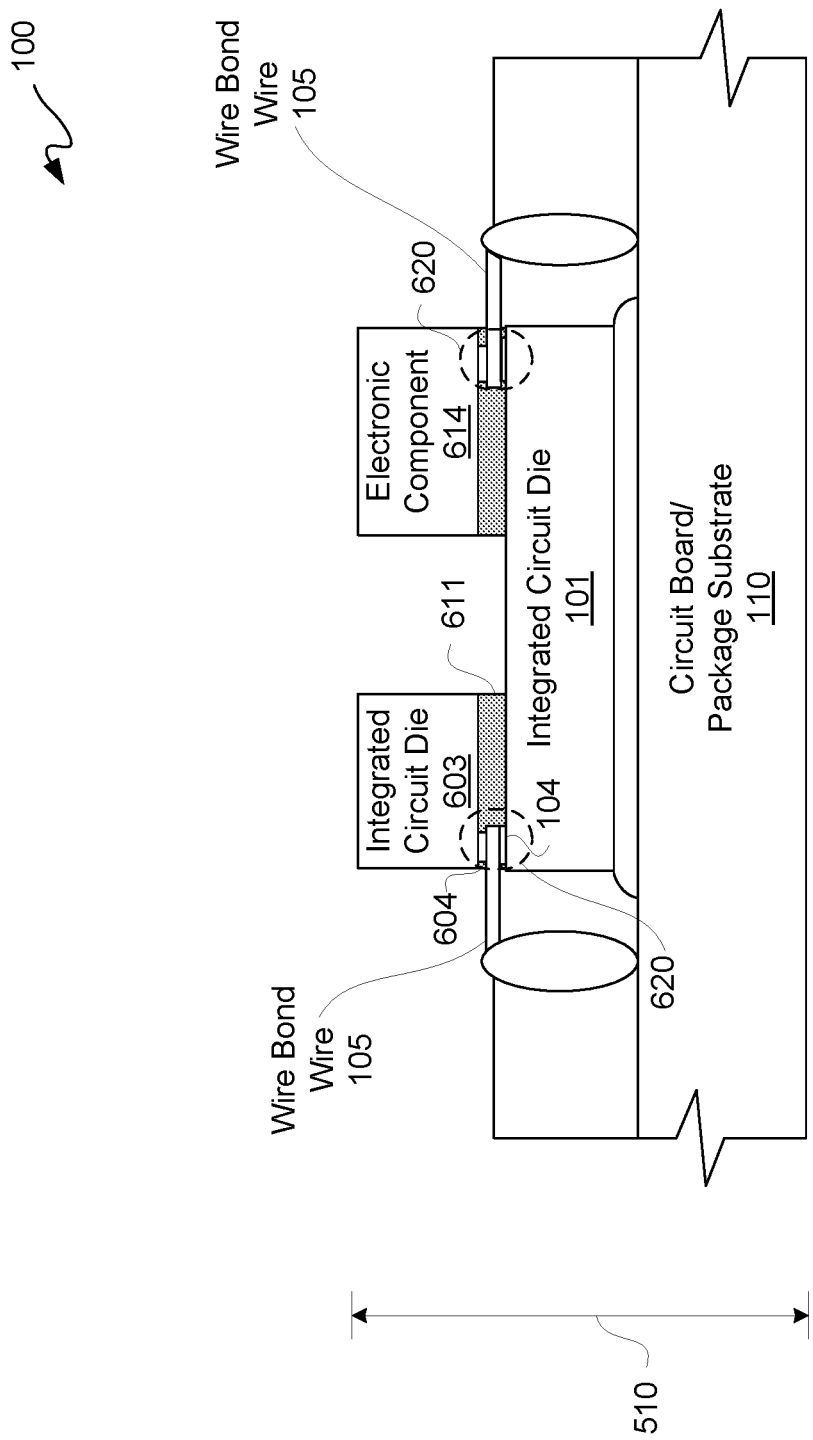
FIG. 6C is a block diagram depicting yet another exemplary low-profile 3DIC microelectronic package.

FIG. 6C is a block diagram depicting yet another exemplary low-profile 3DIC microelectronic package 100. As much of the description of microelectronic package 100 is the same as the description of microelectronic package 100 of FIGS. 6A and 6B, such same description is not repeated for clarity. Generally, microelectronic package 100 of FIG. 6C is the same as microelectronic package 100 of FIG. 6B, except rather than integrated circuit dies 603 and 605, integrated circuit die 605 is replaced with an electronic component 614. For example, electronic component 614 may include one or more discrete resistors, capacitors, and/or inductors. Each electronic component 614 may be coupled to integrated circuit die 101 with common interconnects 620. An ability to interconnect multiple integrated circuit dies to one another along with one or more electronic components in a same low-profile package may be useful in forming hybrid devices for low-profile applications. In some implementations, a component 614 or die 603 may be partially or substantially disposed over molding material layer 111 (not shown) and electrically and physically vertically coupled to package substrate 110 via a bond mass 106 and also coupled physically horizontally to substrate 101 via a wire bond wire 105.

Figure 7A:
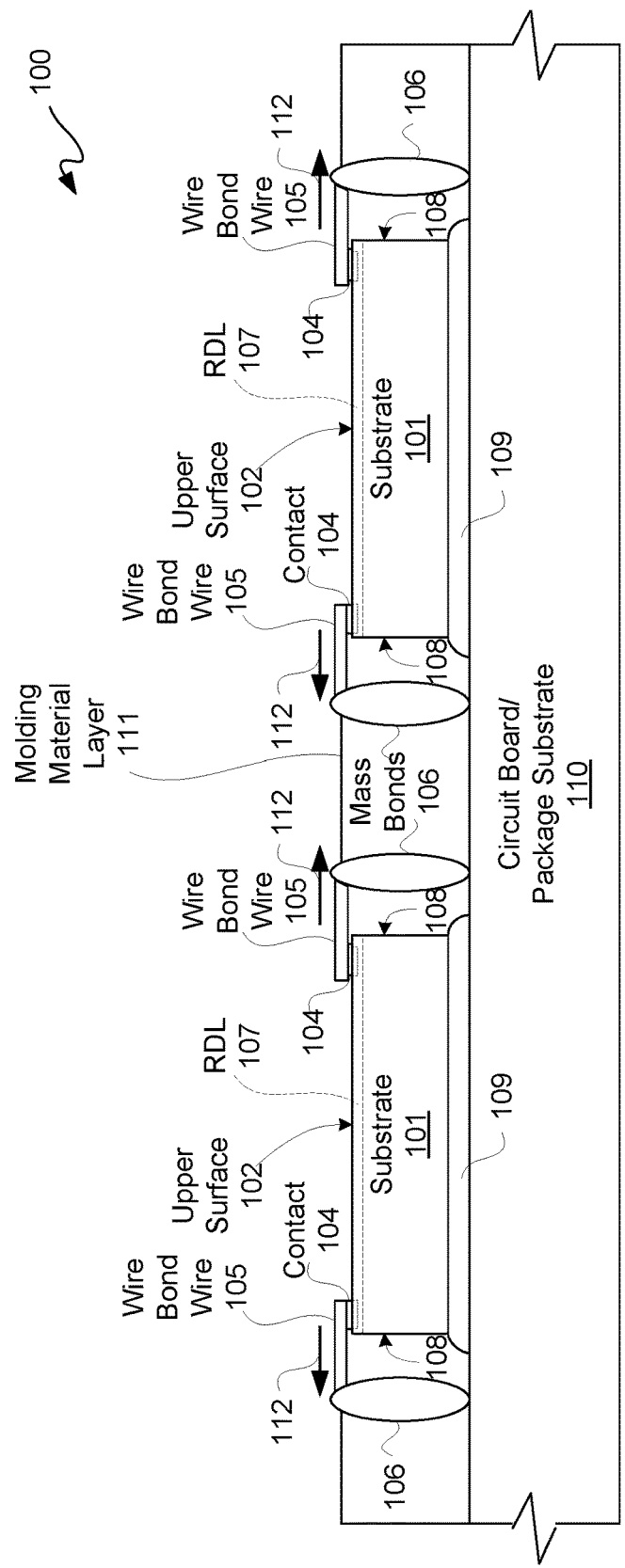
FIG. 7A is a block diagram of a side view depicting an exemplary multi-planar dies microelectronic package.

FIG. 7A is a block diagram of a side view depicting an exemplary multi-planar dies microelectronic package 100. FIG. 7A is effectively two instances of the exemplary microelectronic package 100 of FIG. 1 though coupled to a single instance of a circuit board or package substrate 110. Along those lines, microelectronic package 100 of FIG. 7A may be formed at a wafer level or reconstituted wafer level for having more than one substrate 101 in a same low-profile microelectronic package 100 without using vertical die stacking. In this example, bond masses 106 located between substrates 101 are not common, namely not shared by wire bond wires 105 respectively laterally jutting out from such respective substrates.

Figure 7B:
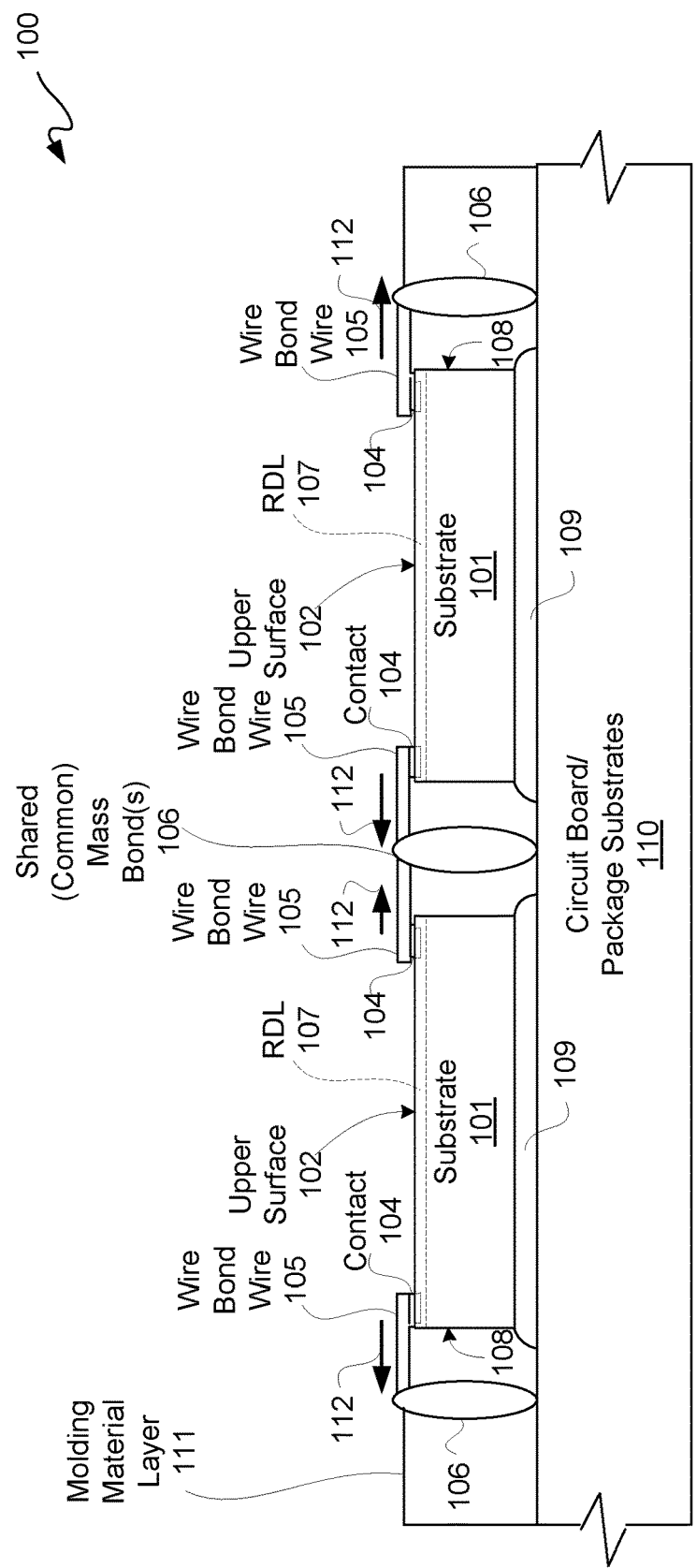
FIG. 7B is the block diagram of FIG. 7A though with common bond masses between neighboring planar substrates.

FIG. 7B is the block diagram of FIG. 7A though with common bond masses 106 between neighboring planar substrates 101. Along those lines, microelectronic package 100 of FIG. 7B may be formed at a wafer level or reconstituted wafer level for having more than one substrate 101 in a same low-profile microelectronic package 100 without using vertical die stacking. In this example, bond masses 106 located between substrates 101 are common, namely shared by wire bond wires 105 respectively laterally jutting out from such respective substrates.

Figure 7C:
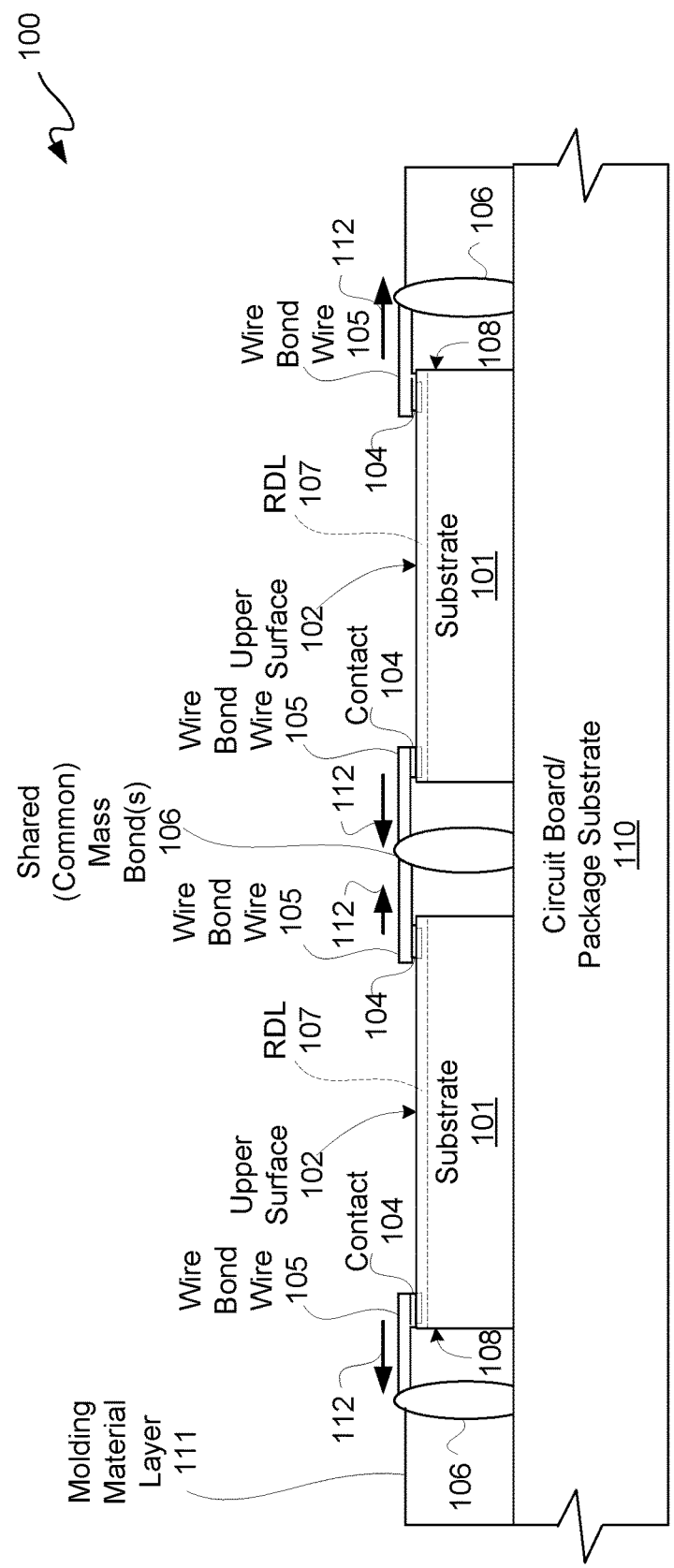
FIG. 7C is the block diagram of FIG. 7B though without an epoxy layer.

FIG. 7C is the block diagram of FIG. 7B though without an epoxy layer 109. Along those lines, microelectronic package 100 of FIG. 7C may be formed at a wafer level or reconstituted wafer level for having more than one substrate 101 in a same low-profile microelectronic package 100 without using vertical die stacking. In this example, bond masses 106 located between substrates 101 are common, namely shared by wire bond wires 105 respectively laterally jutting out from such respective substrates. Bond masses 106 are reflowed for interconnection with a circuit board or package substrate 110.

Figure 8:
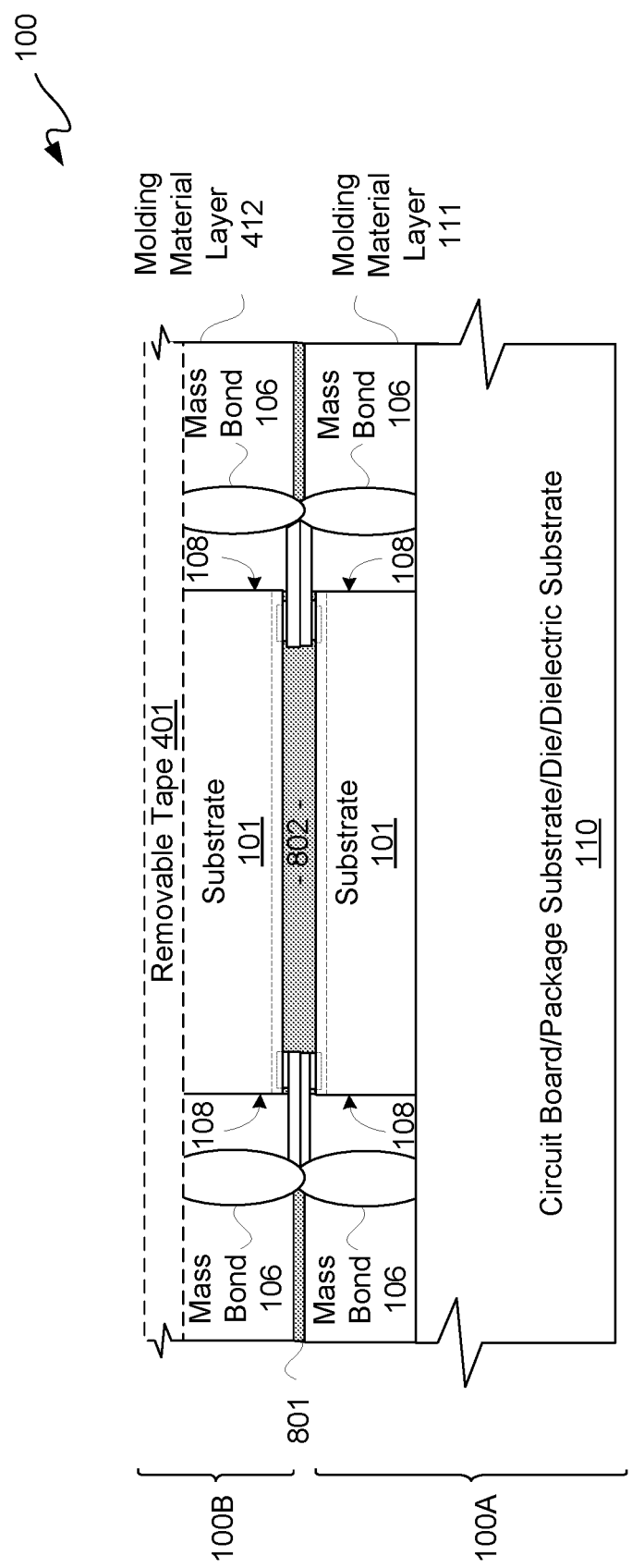
FIG. 8 is a block diagram of a side view depicting still yet another exemplary 3DIC microelectronic package 100.

FIG. 8 is a block diagram of a side view depicting an exemplary 3DIC microelectronic package 100. FIG. 8 is effectively an instance of the exemplary microelectronic package 100 of FIG. 4B and a separate inverted instance of the exemplary microelectronic package 100 of FIG. 4A though coupled to one another and to a single instance of a circuit board, integrated circuit die, dielectric substrate, interposer, or package substrate 110.

Along those lines, microelectronic package 100 of FIG. 8 may be formed by inverting microelectronic package 100B onto microelectronic package 100A, where substrates 101 of microelectronic packages 100A and 100B have surfaces facing one another for defining a gap 802 therebetween. Removable tape 401 may or may not be present for this operation.

Microelectronic packages 100A and 100B may then be reflowed for interconnecting bond masses 106 of such respective packages to one another. This reflow may follow a reflow for interconnecting bond masses 106 of microelectronic package 100A to package substrate 110. Optionally, this same reflow may be used for interconnecting bond masses 106 of microelectronic package 100A to package substrate 110. After such reflow, a fill layer 801 may be injected into gap 802 and/or otherwise between interconnected microelectronic packages 100A and 100B for providing microelectronic package 100.

Figure 9:
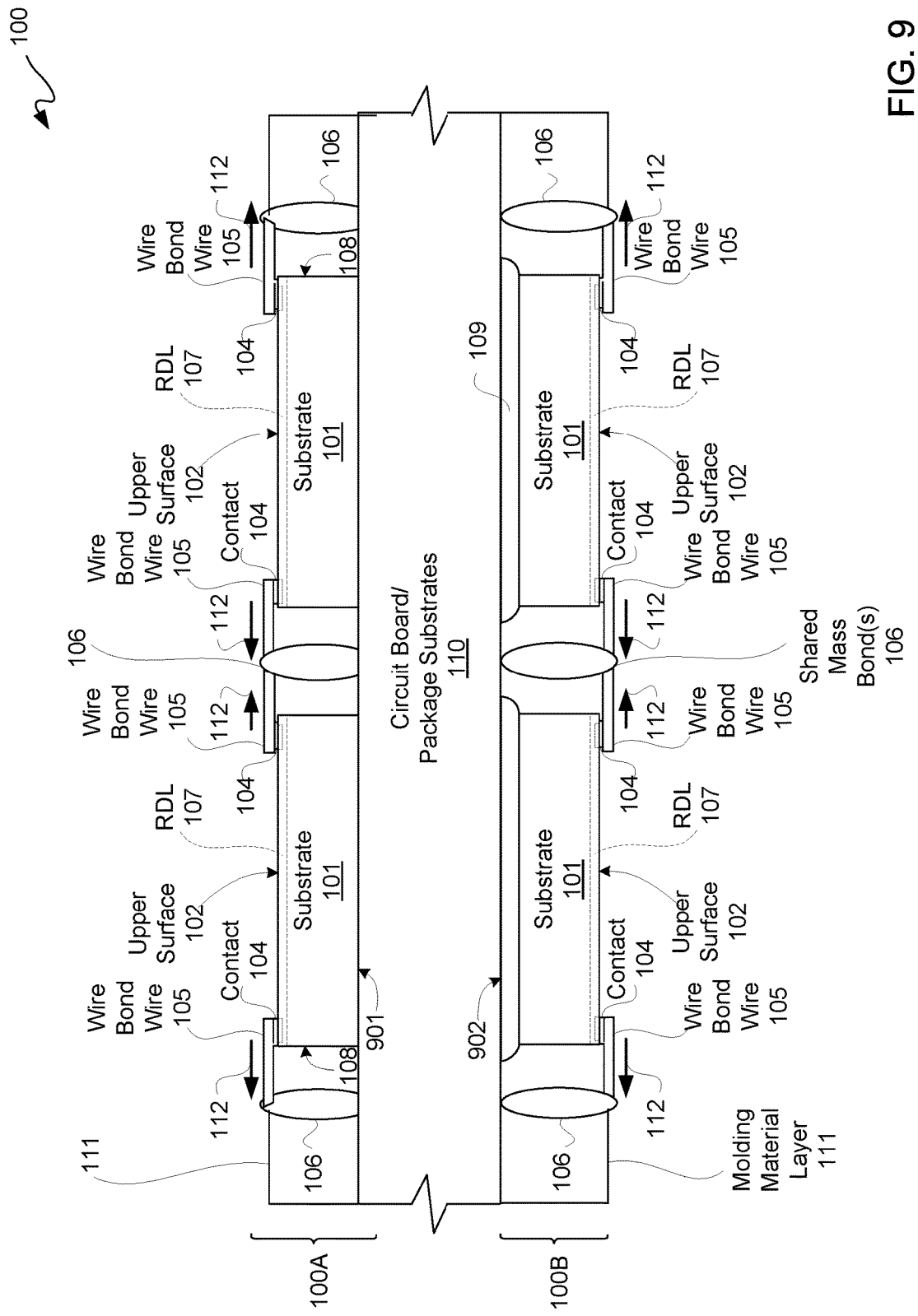
FIG. 9 is a block diagram of a side view depicting an exemplary clam-shell configuration of two instances of multi-planar dies microelectronic packages of FIGS. 7B and 7C though coupled to a single circuit board or package substrate.

FIG. 9 is a block diagram of a side view depicting an exemplary clam-shell configuration of two instances of multi-planar dies microelectronic package 100 of FIGS. 7B and 7C though coupled to a single circuit board or package substrate 110. Along those lines, a lower instance of microelectronic package 100 ("100B") of FIG. 7B may be coupled to a then upper (though lower surface as shown in FIG. 9) surface 902 of a circuit board or package substrate 110 with an epoxy layer 109 for example. Such an in-process microelectronic package 100 may be inverted or flipped for attachment of an upper instance of microelectronic package 100 ("100A") of FIG. 7C.

A lower surface of upper instance of microelectronic package 100A may be attached to an upper surface 901 of circuit board or package substrate 110 by reflowing of bond masses 106. Heat may be directed to such upper instance of microelectronic package 100A for such reflow.

As described above with reference to FIG. 1, vias 166 may be etched for forming bond masses 106. However, forming vias 166 may be avoided, as described below in additional detail.

Figure 10A:
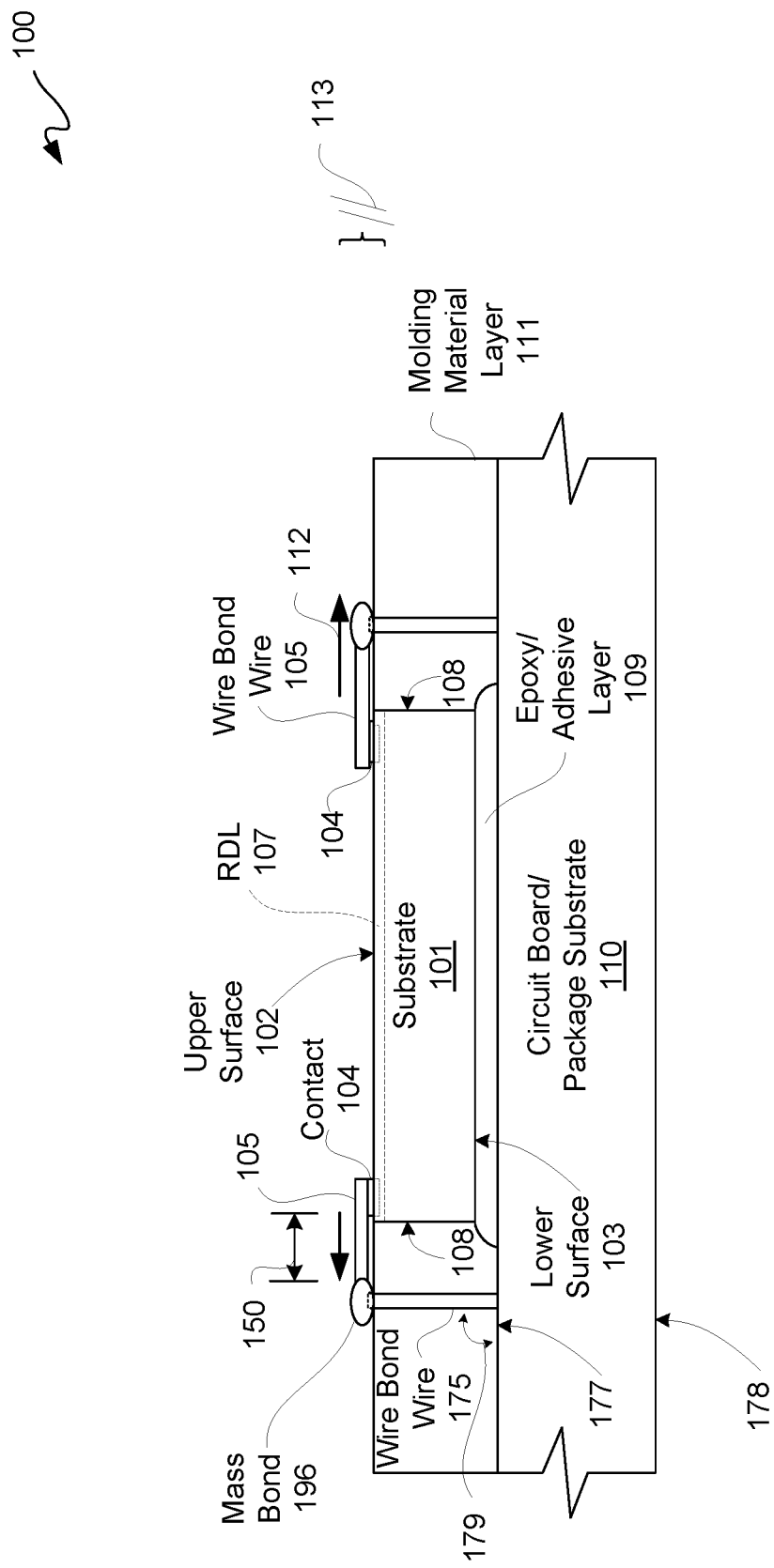
FIGS. 10A through 10C are block diagrams of side views of respective exemplary microelectronic packages using vertical wire bond wires.
Figure 10B:
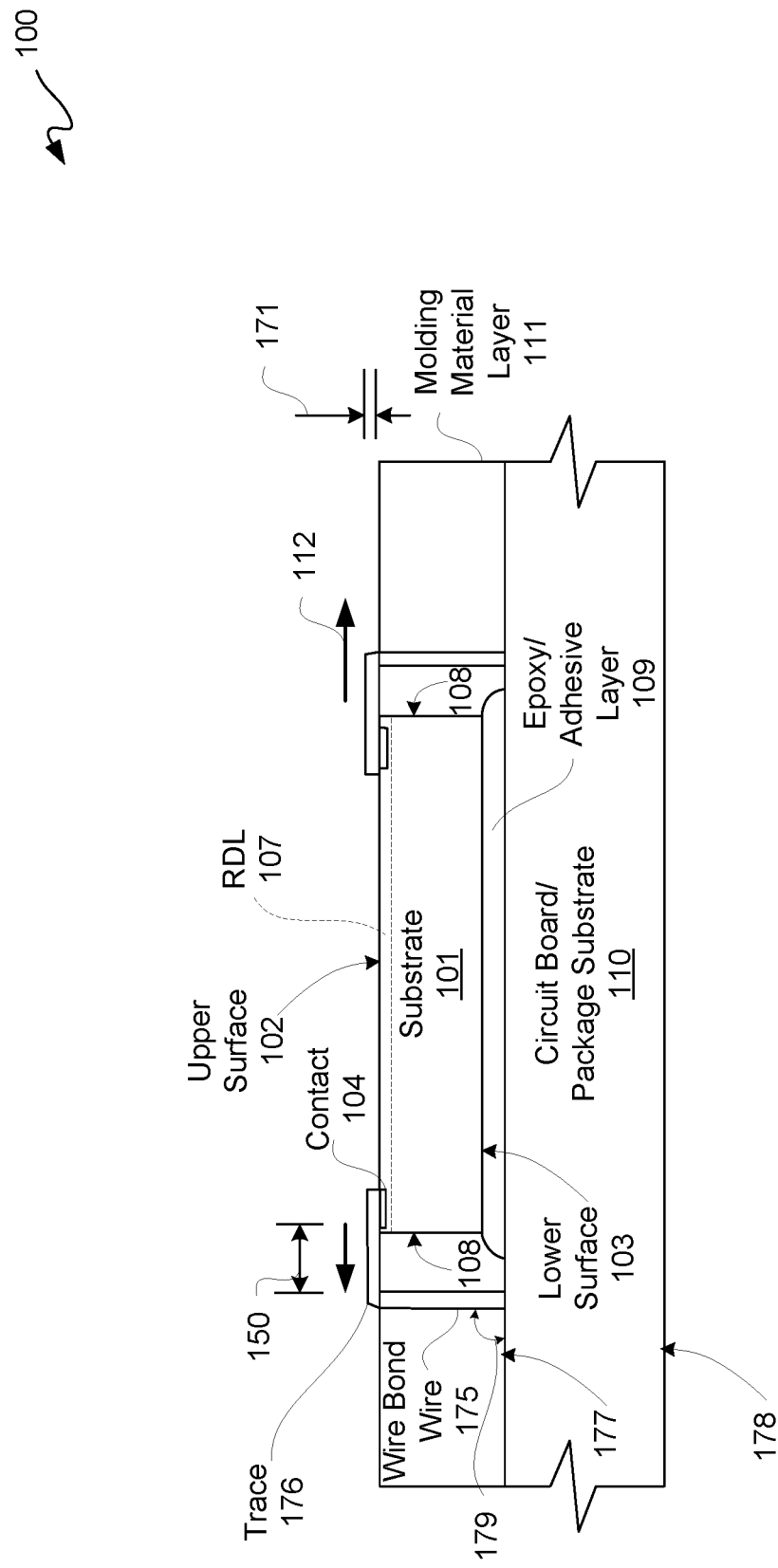
Figure 10C:
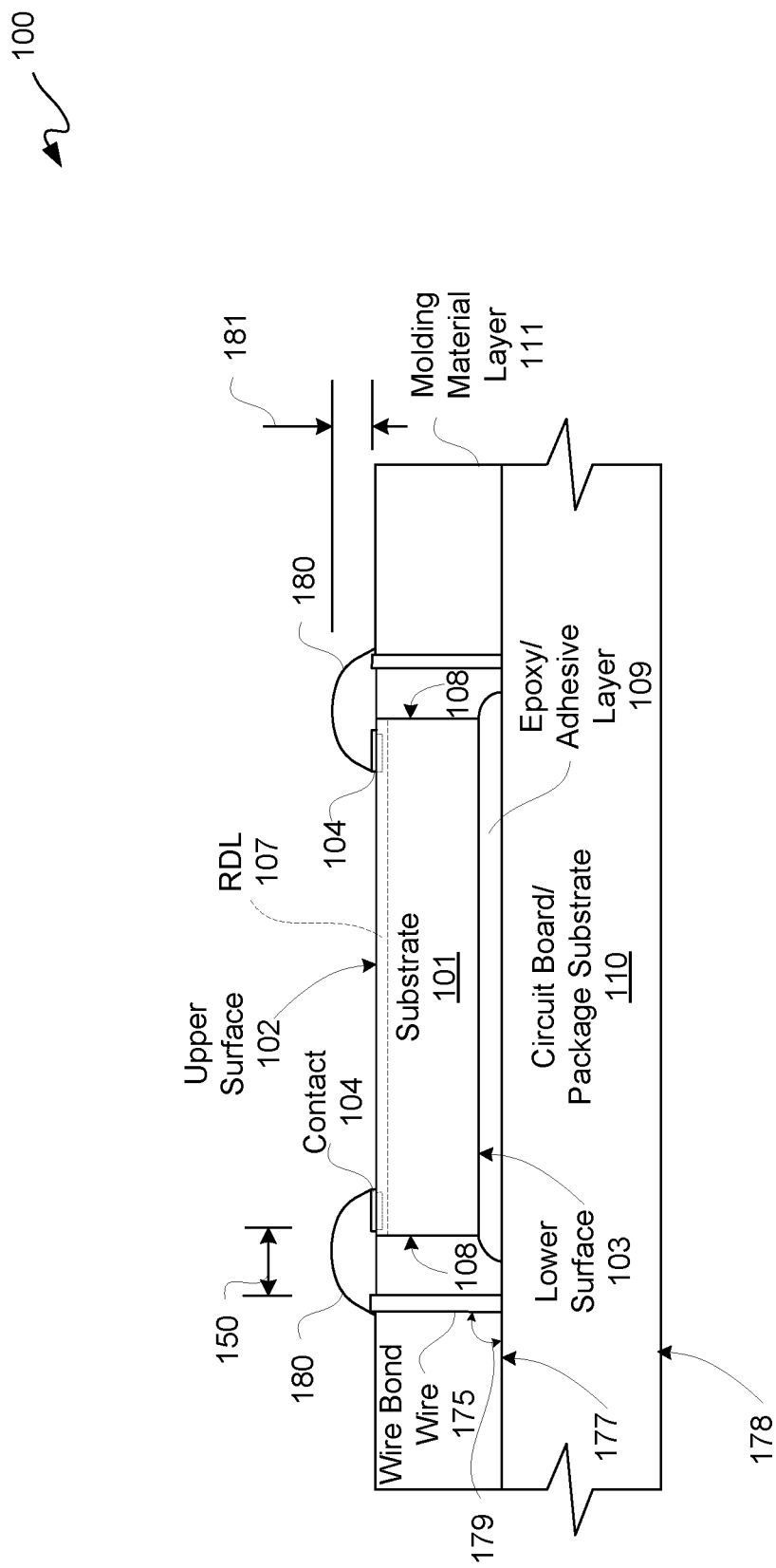

Along those lines, FIGS. 10A through 10C are block diagrams of side views of respective exemplary microelectronic packages 100 using vertical wire bond wires 175. As much of the description of microelectronic packages 100 of FIGS. 10A and 10B has previously been described herein with reference to FIGS. 1 through 9, such same description is not repeated hereinbelow for purposes of clarity and not limitation.

With reference to FIG. 10A, vertical wire bond wires 175 may be coupled to an upper surface 177 of a circuit board, package substrate, another integrated circuit die, a dielectric substrate, or an interposer ("substrate") 110. Substrate 110 may have a lower surface 178 opposite such upper surface 177. After attaching or coupling vertical wire bond wires 175 and substrate 101 to substrate 110, a molding material layer 111 may be formed. Molding material layer 111 may cover side portions of both substrate 101 and vertical wire bond wires 175, as well as being on an upper surface 177 of substrate 110.

Vertical wire bond wires 175 may be offset from sidewalls 108 by approximately an offset distance 150, similar to bond masses 106. Vertical wire bond wires 175 may be stitch bonded or ball bonded to such upper surface 177 of package substrate 110.

A vertical wire bond wire 175 may be coupled to upper surface 177 at a lower end of such wire. A vertical wire bond wire 175 may extend vertically away from upper surface 177 of substrate 110. Along those lines, a vertical wire bond wire 175 may be perpendicular with respect to upper surface 177. By vertical or perpendicular, it is generally meant at an angle of 90 degrees within +/−10 degrees from a coupling surface, such as upper surface 177 for example.

A joining mass ("mass") bond 196 may be coupled to an upper end of vertical wire bond wire 175. A horizontal wire bond wire 105, which may be of a set of wire bond wires 105 of different horizontal lengths as previously described, may be coupled to a contact 104 of substrate 101 at a proximal end of horizontal wire bond wire 105 and coupled to bond mass 196 at a distal end of such horizontal wire bond wire. Again, horizontal wire bond wire 105 may laterally jut out horizontally away from upper surface 102 of substrate 101 for at least a distance of approximately 2 to 3 times a diameter of such horizontal wire bond wire 105. Bond masses 196 may for example be screen printed at distal ends of horizontal and vertical wire bond wires joining or proximal to one another prior to a reflow operation, and a reflow operation may follow for interconnecting such ends of such horizontal and vertical wire bond wires.

Horizontal wire bond wire 105 may be horizontal for an offset distance 150 with respect to being co-planar with upper surface 102 within +/−10 degrees. Along those lines, an upper surface of contact 104 and an upper end of vertical wire bond wire 175 may be above an upper surface of molding material layer 111. Horizontal wire bond wire 105 may be cantilevered extending from such upper surface of contact 104 over and above an upper surface of molding material layer 111. Optionally, horizontal wire bond wire 105 may span an offset distance by having a distal end thereof directly contact an upper end of vertical wire bond wire 175 prior to forming bond mass 196. Bond mass 196 may be formed using solder.

Microelectronic package 100 of FIG. 10B is similar to microelectronic package 100 of FIG. 10A, and so same description is not repeated for purposes of clarity and not limitation. With reference to FIGS. 10B and 10C, a surface interconnect, such as a horizontally disposed surface trace 176 or a surface bond mass 180, respectively, may be formed on an upper surface of molding material layer 111, as well as coupled to a contact 104 of substrate 101 at a proximal end of such surface interconnect and coupled to an upper end of vertical wire bond wire 175 at a distal end of such surface interconnect.

With reference to FIG. 10B, a surface trace 176 may be formed by wetting portions of an upper surface of molding material layer with seed stripes (not shown), as is known. Examples of such seed plating materials include nickel, gold, and tantalum, among others. A plating material, such as a metal or metal alloy, may be plated onto such upper surface for adhering to seed stripes, well as upper ends of wire bond wires, and contacts 104. This adherence of a plating material may be used to provide surface traces 176, which have a thickness in a range of approximately 2 to 5 microns for low profile packaging. This plating material may be solder or other interconnect material.

With reference to FIG. 10C, a surface bond mass 180 may be formed by depositing solder or another interconnect material in sufficient mass for interconnecting a contact 104 with a corresponding upper end of a vertical wire bond wire 175. This adherence of surface bond masses 180 to contacts 104 and vertical wire bond wires 175 may be used to provide surface interconnects, which have a thickness in a range of approximately 200 to 300 microns for low profile packaging.

In another implementation, substrates 101 and 110 may be coupled to one another face-to-face, with an upper surface substrate 110 facing an upper surface of substrate 101. In this configuration, one or more wire bond wires 175 may be wire bonded or otherwise coupled to and extend vertically away from an upper surface of substrate 110. Another end or ends of such wire bond wires 175 may be mechanically, as well as electrically, coupled to one or more pads or traces on an upper surface of substrate 101 (inverted from the illustration in FIG. 10C) by one or more bond masses 180.

In yet another implementation, a horizontal wire bond wire 105 or surface interconnect 176 can be disposed along an upper surface of substrate 101, and a bond mass 196 can be disposed on an upper surface of molding material layer 111 prior to mechanical union of such wire bond wire 175/surface interconnect 176 and mass bond 196. A molding material layer 111 can cover side portions of both substrate 101 and wire bond wire 175. A wire bond wire 105, or a surface interconnect 176 on molding material layer 111, can be coupled to a contact 104 of substrate 101 at a first end of such wire bond wire 105 or surface interconnect 176. A second end of such wire bond wire 105, or surface interconnect 176, may be coupled to such a wire bond wire 175. In some implementations, another insulative layer may be disposed between wire bond wire 175 and molding material layer 111.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic package, comprising:
a substrate having an upper surface and a lower surface opposite the upper surface;
a first side of a first wire bond wire of a first length ball or stitch bonded to the upper surface at a first end of the first wire bond wire;
a first bond mass coupled to a second end of the first side of the first wire bond wire;
a first side of a second wire bond wire of a second length ball or stitch bonded to the upper surface at a first end of the second wire bond wire;
a second bond mass coupled to a second end of the first side of the second wire bond wire; and
the first wire bond wire and the second wire bond wire laterally jutting out horizontally away from the upper surface of the substrate, wherein the first and second bond masses have surfaces that are coplanar with, or extend beyond, the upper surface of the substrate.

2. A microelectronic package, comprising:
a substrate having an upper surface and a lower surface opposite the upper surface;
first wire bond wires of a first length coupled to the upper surface at first ends of the first wire bond wires;
first bond masses coupled to second ends of the first wire bond wires;
the first wire bond wires laterally jutting out from the upper surface of the substrate;
second wire bond wires of a second length coupled to the upper surface at first ends of the second wire bond wires;
second bond masses coupled to second ends of the second wire bond wires; and
the second wire bond wires laterally jutting out horizontally away from the upper surface of the substrate for at least a first distance of approximately 0.5 to 5 times a diameter of a second wire bond wire of the second wire bond wires.

3. The microelectronic package according to claim 2, wherein:
the first wire bond wires laterally jut out horizontally away from the upper surface of the substrate for at least a second distance of approximately 0.5 to 5 times a diameter of a first wire bond wire of the first wire bond wires; and
the second wire bond wires are interleaved with the first wire bond wires.

4. The microelectronic package according to claim 2, wherein:
the substrate is an integrated circuit die; and
the first bond masses and the second bond masses respectively interconnect the first wire bond wires and the second wire bond wires to a circuit board or package substrate.

5. The microelectronic package according to claim 4, wherein the second ends of the second wire bond wires are situated further away from the integrated circuit die than the second ends of the first wire bond wires.

6. The microelectronic package according to claim 4, wherein the first ends of the second wire bond wires are coupled closer to sides of the integrated circuit die than the first ends of the first wire bond wires.

7. The microelectronic package according to claim 6, wherein:
the upper surface of the integrated circuit die comprises rows of inner contacts and rows of outer contacts;
the rows of inner contacts being located between the rows of outer contacts;
the first ends of the first wire bond wires coupled to the rows of inner contacts;
the first ends of the second wire bond wires coupled to the rows of the outer contacts; and
the second ends of the first wire bond wires and the second wire bond wires form two rows respectively thereof spaced apart from one another.

8. The microelectronic package according to claim 2, wherein pairs of the first wire bond wires or the second wire bond wires are interconnected to one another at the second ends respectively thereof.

9. The microelectronic package according to claim 4, wherein:
the integrated circuit die includes an array of sensors for capturing an image; and
the microelectronic package further comprises a glass cover located over, spaced apart from and coupled to the upper surface of the integrated circuit die.

10. The microelectronic package according to claim 9, wherein:
a lower surface of the glass cover is opposite the upper surface of the integrated circuit die;
the lower surface of the glass cover comprises inner pads and outer pads interconnected to one another;
the inner pads are located between the outer pads;
the first ends of both the first wire bond wires and the second wire bond wires are coupled to the outer pads;
contacts on the upper surface of the integrated circuit die are interconnected to the inner pads;
the second length is longer than the first length; and
the second ends of the first wire bond wires and the second wire bond wires form two rows respectively thereof spaced apart from and interleaved with one another.

11. The microelectronic package according to claim 9, wherein vertical distance from an upper surface of the glass cover to the lower surface of the integrated circuit die is in a range of approximately 0.5 to 500 microns.

12. The microelectronic package according to claim 4, wherein:
the integrated circuit die is a first integrated circuit die; and
the microelectronic package further comprises a second integrated circuit die located over, spaced apart from and coupled to the upper surface of the integrated circuit die.

13. The microelectronic package according to claim 4, the microelectronic package further comprising a discrete electronic component located over and coupled to the upper surface of the integrated circuit die.

* * * * *